United States Patent
Yoon et al.

(10) Patent No.: US 9,023,704 B2
(45) Date of Patent: May 5, 2015

(54) METHOD FOR FABRICATING A SEMICONDUCTOR DEVICE

(71) Applicant: Samsung Electronics Co., Ltd., Suwon-si, Gyeonggi-do (KR)

(72) Inventors: Il-Young Yoon, Hwaseong-si (KR); Chang-Sun Hwang, Suwon-si (KR); Bo-Kyeong Kang, Seoul (KR); Jae-Seok Kim, Seoul (KR); Ho-Young Kim, Seongnam-si (KR); Bo-Un Yoon, Seoul (KR)

(73) Assignee: Samsung Electronics Co., Ltd., Suwon-Si, Gyeonggi-Do ( * ) Notice: Subject to any disclaimer, the term of this patent is extended or adjusted under 35 U.S.C. 154(b) by 0 days.

(21) Appl. No.: 13/801,341

(22) Filed: Mar. 13, 2013

(65) Prior Publication Data

US 2014/0227847 A1 Aug. 14, 2014

(30) Foreign Application Priority Data

Feb. 14, 2013 (KR) ........................ 10-2013-0015916

(51) Int. Cl.
*H01L 21/336* (2006.01)
*H01L 27/14* (2006.01)
*H01L 29/66* (2006.01)

(52) U.S. Cl.
CPC ................. *H01L 29/66795* (2013.01)

(58) Field of Classification Search
CPC ............... H01L 21/823437; H01L 21/823431; H01L 29/66795; H01L 21/0924; H01L 21/0886
USPC ......... 438/283, 303, 591, 157, 595, 443, 404, 438/197, 218, 270, 690–692, 427, 296; 257/368, E27.06, E21.23
See application file for complete search history.

(56) References Cited

U.S. PATENT DOCUMENTS

| | | | |
|---|---|---|---|
| 5,923,993 A * | 7/1999 | Sahota | 438/427 |
| 6,855,607 B2 | 2/2005 | Achuthan et al. | |
| 7,994,020 B2 | 8/2011 | Lin et al. | |
| 8,497,171 B1 * | 7/2013 | Wu et al. | 438/218 |
| 2006/0284245 A1 * | 12/2006 | Park et al. | 257/324 |

(Continued)

FOREIGN PATENT DOCUMENTS

| | | |
|---|---|---|
| KR | 1020050066963 | 6/2005 |
| KR | 1020070002515 | 1/2007 |
| KR | 1020070082921 | 8/2007 |

OTHER PUBLICATIONS

Investigation of the Slurry for Poly Si Stopping CMP process—Presented on CMP Symposium (E3) Day 2—Oct. 11, 2012 8:00 AM.*

*Primary Examiner* — Amar Movva
*Assistant Examiner* — Sheikh Maruf
(74) *Attorney, Agent, or Firm* — F. Chau & Associates, LLC

(57) ABSTRACT

A method for fabricating a semiconductor device includes forming a pre-isolation layer covering a fin formed on a substrate, the pre-isolation layer including a lower pre-isolation layer making contact with the fin and an upper pre-isolation layer not making contact with the fin, removing a portion of the upper pre-isolation layer by performing a first polishing process, and planarizing the pre-isolation layer such that an upper surface of the fin and an upper surface of the pre-isolation layer are coplanar by performing a second polishing process for removing the remaining portion of the upper pre-isolation layer.

18 Claims, 16 Drawing Sheets

(56) References Cited

U.S. PATENT DOCUMENTS

| | | | |
|---|---|---|---|
| 2010/0015778 A1* | 1/2010 | Lin et al. .................... 438/443 |
| 2010/0041198 A1 | 2/2010 | Zhu et al. |
| 2010/0044784 A1* | 2/2010 | Oh et al. .................... 257/329 |
| 2010/0200933 A1* | 8/2010 | Kahng et al. ............... 257/401 |
| 2011/0097889 A1 | 4/2011 | Yuan et al. |
| 2011/0111565 A1* | 5/2011 | Nawaz ........................ 438/157 |
| 2011/0121406 A1 | 5/2011 | Lee et al. |
| 2011/0133292 A1 | 6/2011 | Lee et al. |
| 2011/0134684 A1 | 6/2011 | Marshall et al. |
| 2011/0183508 A1 | 7/2011 | Chan et al. |
| 2011/0298025 A1 | 12/2011 | Haensch et al. |
| 2011/0298041 A1 | 12/2011 | Renn |
| 2011/0316081 A1 | 12/2011 | Chan et al. |
| 2012/0015493 A1 | 1/2012 | Lin et al. |
| 2012/0032732 A1 | 2/2012 | Xiao et al. |
| 2012/0080755 A1* | 4/2012 | Kim et al. .................... 257/368 |
| 2013/0082304 A1* | 4/2013 | Liu et al. ..................... 257/192 |
| 2013/0161729 A1* | 6/2013 | Xie ............................... 257/329 |
| 2013/0200483 A1* | 8/2013 | Tung ............................ 257/506 |

* cited by examiner

METHOD FOR FABRICATING A SEMICONDUCTOR DEVICE

CROSS-REFERENCE TO RELATED APPLICATION

This application claims priority to Korean Patent Application No. 10-2013-0015916 filed on Feb. 14, 2013, the disclosure of which is hereby incorporated by reference herein in its entirety.

TECHNICAL FIELD

The present disclosure relates to a method for fabricating a semiconductor device.

DISCUSSION OF THE RELATED ART

For a scaling technology for increasing the density of a semiconductor device, a multi-gate transistor having a fin-shaped silicon body formed on a substrate and a gate formed on the surface of the fin-shaped silicon body has been proposed.

As a multi-gate transistor may use a three-dimensional channel, scaling technology may be readily achieved. In addition, the current control capacity can be increased without increasing the gate length. Further, a short channel effect (SCE), in which the electric potential of the channel region is affected by the drain voltage, can be effectively suppressed. In particular, a tri-gate structure using channels formed on three planes of a semiconductor body is beneficial in terms of a large design error allowance with respect to the width and height of the semiconductor body.

SUMMARY

Exemplary embodiments of the present invention provide a method for fabricating a semiconductor device, which can reduce a height variation of an active region of a fin by removing non-uniformity of a thickness of a device isolation layer occurring during planarization of the device isolation layer before a fin recess process.

According to an exemplary embodiment of the present invention, there is provided a method for fabricating a semiconductor device, the method including forming a pre-isolation layer covering a fin formed on a substrate, the pre-isolation layer including a lower pre-isolation layer making contact with the fin and an upper pre-isolation layer not making contact with the fin, removing a portion of the upper pre-isolation layer by performing a first polishing process, and planarizing the pre-isolation layer such that an upper surface of the fin and an upper surface of the pre-isolation layer are coplanar by performing a second polishing process for removing the remaining portion of the upper pre-isolation layer.

According to an exemplary embodiment of the present invention, there is provided a method for fabricating a semiconductor device, the method including forming a mask pattern on a substrate, forming a fin protruding on the substrate by etching the substrate using the mask pattern, forming a pre-isolation layer covering the fin and the mask pattern, exposing the mask pattern by removing a portion of the pre-isolation layer by performing a first polishing process, and planarizing the pre-isolation layer such that an upper surface of the fin and an upper surface of the pre-isolation layer are coplanar by performing a second polishing process for exposing the mask pattern and then exposing the upper surface of the fin.

According to an exemplary embodiment of the present invention, a method for fabricating a semiconductor device is provided. The method includes forming a first mask pattern on a substrate, forming a mask layer substantially conformally along an upper surface of the substrate having the first mask pattern, patterning the mask layer to form a second mask pattern exposing the first mask pattern, removing the first mask pattern to expose the substrate on both sides of the mask pattern, forming a plurality of fins on a first region of the substrate but not on a second region of the substrate by etching the substrate using the second mask pattern, forming a pre-isolation layer covering the fins and the second mask pattern remaining on upper surfaces of the fins, exposing the second mask pattern by removing a portion an upper layer of the pre-isolation layer covering the fins by performing a first polishing process, and performing a densification process to oxidize the upper layer of the pre-isolation layer after exposing the second mask pattern.

In addition, the method further includes removing a portion of the upper layer of the pre-isolation layer surrounding lateral surfaces of the second mask pattern, removing the second mask pattern after removing the portion of the upper layer of the pre-isolation layer, thereby exposing the upper surfaces of the fins, doping impurities into the fins after removing the second mask pattern, removing the remaining portion of the upper layer of the pre-isolation layer by performing a second polishing process, thereby planarizing the pre-isolation layer such that the upper surface of the fins are coplanar with an upper surface of the pre-isolation layer and removing a portion of a lower layer of the pre-isolation layer to thereby form an isolation layer which contacts a lower portion of the fins and wherein the fins protrude from isolation layer.

BRIEF DESCRIPTION OF THE DRAWINGS

Exemplary embodiments of the present invention can be understood in more detail from the following detailed description taken in conjunction with the attached drawings in which.

DETAILED DESCRIPTION OF EXEMPLARY EMBODIMENTS

Exemplary embodiments of the present invention will now be described more fully hereinafter with reference to the accompanying drawings, in which exemplary embodiments of the invention are shown. The same reference numbers indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. As used herein, the term "and/or" includes any and all combinations of one or more of the associated listed items.

It will also be understood that when a layer is referred to as being "on" another layer or substrate, it can be directly on the other layer or substrate, or intervening layers may also be present.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Hereinafter, a method for fabricating a semiconductor device according to an embodiment of the present invention will be described with reference to FIGS. 1 to 9.

FIGS. 1 to 9 are cross-sectional views illustrating intermediate steps in a method for fabricating a semiconductor device according to an embodiment of the present invention.

Figure 1:
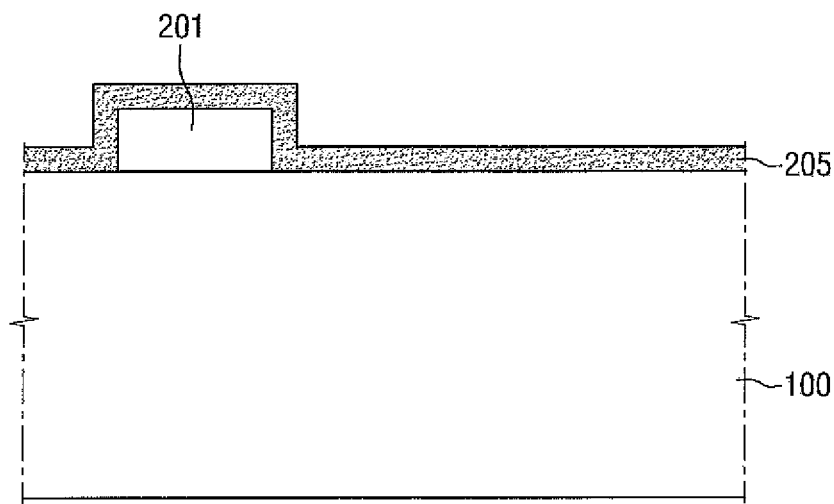
FIGS. 1 to 9 are cross-sectional views illustrating intermediate steps in a method for fabricating a semiconductor device according to an exemplary embodiment of the present invention.

Referring to FIG. 1, a first mask pattern 201 may be formed on a substrate 100. A second mask layer 205 may be formed on the substrate 100 having the first mask pattern 201.

The substrate 100 may be, for example, a bulk silicon wafer or a silicon-on-insulator (SOI) wafer. Alternatively, the substrate 100 may be, for example, a silicon substrate, or or may include other materials such as, but not limited to, silicon germanium, indium antimonide, lead telluride, lead telluride, indium arsenide, indium phosphide, gallium arsenide, or gallium antimonide. Alternatively, the substrate 100 may be, for example, an epitaxial layer formed on a base substrate. In the method for fabricating a semiconductor device according to the present embodiment of the present invention, the substrate 100 is a silicon substrate.

The second mask layer 205 may be, for example, substantially conformally formed along an upper surface of the substrate 100 substrate 100 having the first mask pattern 201. The first mask pattern 201 and the second mask layer 205 may include, for example, materials having etching selectivity with respect to each other. For example, the second mask layer 205 may include at least one of silicon oxide, silicon nitride, silicon oxynitride, a metal layer, a photo resist, a spin on glass (SOG) mask and/or spin on hard (SOH) mask. The first mask pattern 201 may be made of, for example a material among the materials, different from the material forming the second mask layer 205. The first mask pattern 201 and the second mask layer 205 may be formed by, for example, at least one of physical vapor deposition process (PVD), chemical vapor deposition process (CVD), atomic layer deposition (ALD), and spin coating.

Figure 2:
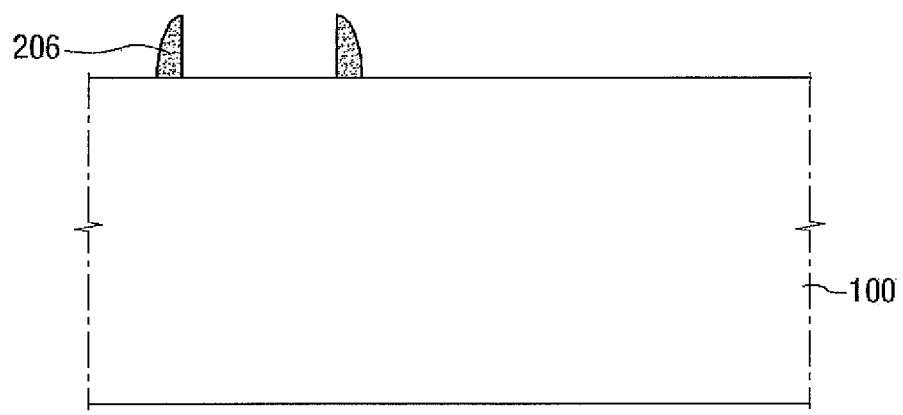

Referring to FIG. 2, a second mask pattern 206 may be formed from the second mask layer 205 through, for example, an etching process. The second mask pattern 206 may be in the form of, for example, a spacer exposing the first mask pattern 201. The first mask pattern 201 exposed by the second mask pattern 206 is removed, thereby exposing the substrate 100 to both sides of the second mask pattern 206. The removing of the first mask pattern 201 may minimize etching of the second mask pattern 206 and may be performed by, for example, selectively etching the first mask pattern 201.

Figure 3:
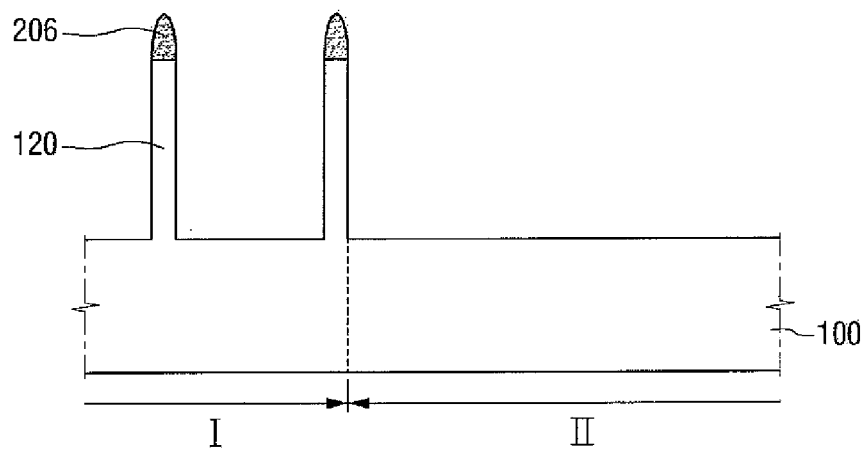

Referring to FIG. 3, the substrate 100 is etched using, for example, the second mask pattern 206 as an etch mask. A portion of the substrate 100 is etched, thereby forming a fin 120 on the substrate 100. The second mask pattern 206 may remain on the fin 120.

The substrate 100 may include a first region I and a second region II. The first region I may be, for example, a circuit region where a transistor is formed, and the second region II may be, for example, a region positioned between different circuit regions to isolate the circuit regions or an isolation region positioned in a circuit region to define the circuit region, but exemplary embodiments of the present invention are not limited thereto. The fin 120 is formed on the first region I of the substrate 100 and may not be formed on the second region II of the substrate 100. That is to say, the fin 120 formed on the substrate 100 may be formed, for example, only on the first region I and may not be formed on the second region II.

Figure 4:
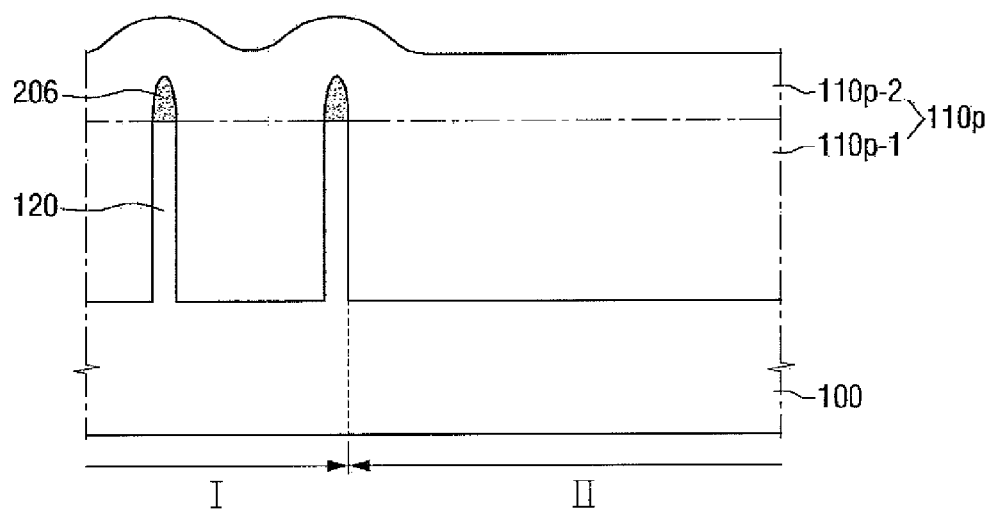

Referring to FIG. 4, a pre-isolation layer 110p covering the fin 120 formed on the substrate 100 may be formed. The pre-isolation layer 110p may be formed, for example, not only on the first region I having the fin 120 but on the second region II without the fin 120. The pre-isolation layer 110p may include, for example, a lower pre-isolation layer 110p-1 and an upper pre-isolation layer 110p-2. The lower pre-isolation layer 110p-1 may be a portion formed by, for example, making contact with lateral surfaces of the fin 120, and the upper pre-isolation layer 110p-2 may be a portion formed by, for example, not making contact with the lateral surfaces of the fin 120. The second mask pattern 206 formed on the fin 120 may be covered by, for example, the pre-isolation layer 110p, specifically by the upper pre-isolation layer 110p-2.

The pre-isolation layer 110p may include, for example, at least one of silicon oxide, silicon nitride, and silicon oxynitride.

Figure 5:
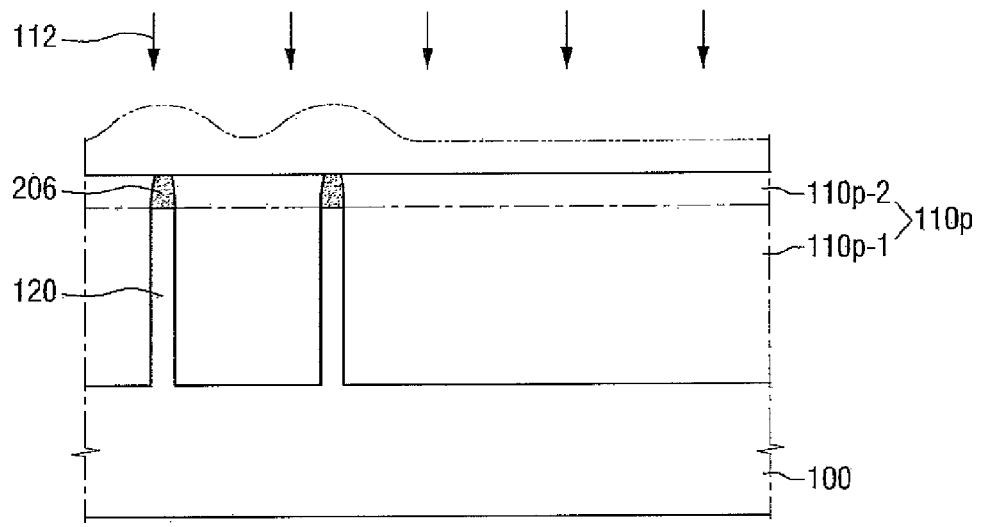

Referring to FIG. 5, a portion of the pre-isolation layer 110p may be removed by, for example, performing a first polishing process. That is to say, the portion of the upper pre-isolation layer 110p-2 may be removed by performing the first polishing process. As a result of the first polishing process, the second mask pattern 206 may be exposed.

The first polishing process may be, for example, a chemical mechanical polishing (CMP) process. If the upper surface of the pre-isolation layer 110p covering the fin 120 is not planar, it may be planarized by, for example, performing the first polishing process.

For example, after the second mask pattern 206 is exposed, a densification process 112 for densifying the pre-isolation layer 110p may further be performed. As the result of the densification process 112, the pre-isolation layer 110p, specifically, the upper pre-isolation layer 110p-2, may be densified. The densification process 112 may include, for example, oxidizing the upper pre-isolation layer 110p-2.

Figure 6:
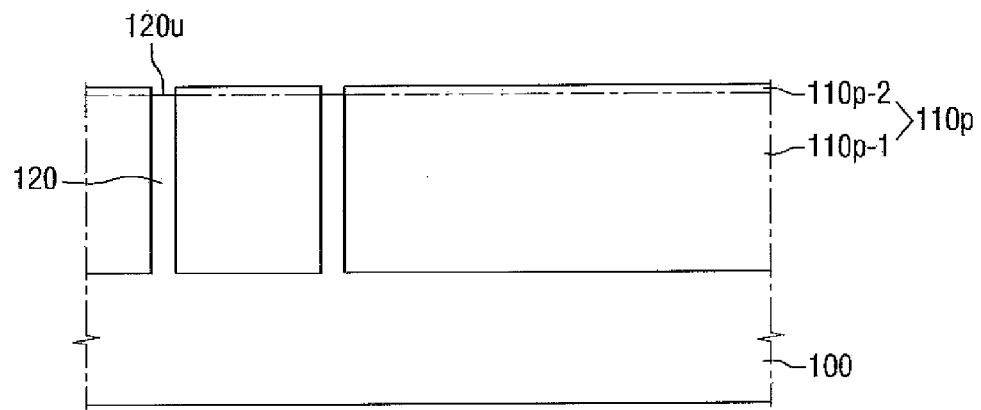

Referring to FIG. 6, the second mask pattern 206 is removed, thereby exposing an upper surface 120u of the fin 120.

For example, a portion of the upper pre-isolation layer 110p-2 surrounding lateral surfaces of the second mask pattern 206 may be removed by performing, for example, an etching process. The removing of the portion of the upper pre-isolation layer 110p-2 may be performed by, for example, a wet etching process. When the pre-isolation layer 110p is made of silicon oxide, the portion of the upper pre-isolation layer 110p-2 may be removed by the wet etching process using, for example, hydrogen fluoride (HF). After the wet etching process, a portion of the upper pre-isolation layer 110p-2 remains on the lower pre-isolation layer 110p-1.

After the wet etching process for removing the portion of the upper pre-isolation layer 110p-2, the second mask pattern 206 may be removed. The second mask pattern 206 may be removed by, for example, wet etching. After the wet etching for removing the second mask pattern 206, the upper surface 120u of the fin 120 may be exposed. After removing the second mask pattern 206, the upper surface 120u of the fin 120 may be closer to the upper surface of the substrate 100 than to the upper surface of the pre-isolation layer 110p.

Figure 7:
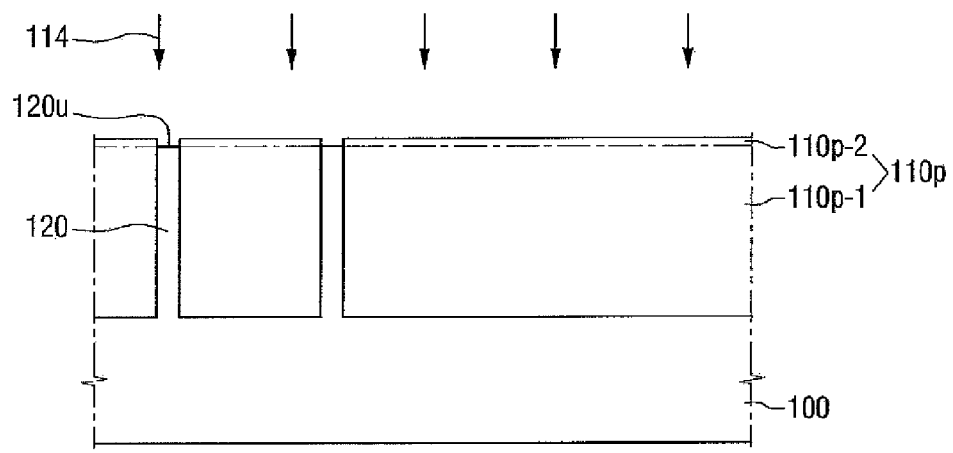

Referring to FIG. 7, impurities may be, for example, doped into the fin 120 by ion implantation 114.

For example, after removing the second mask pattern 206, the impurities may be doped into the exposed upper surface 120u of the fin 120 by the ion implantation 114. For example, the impurities may be doped into a source/drain region and a channel region of a transistor by the ion implantation 114.

Figure 8:
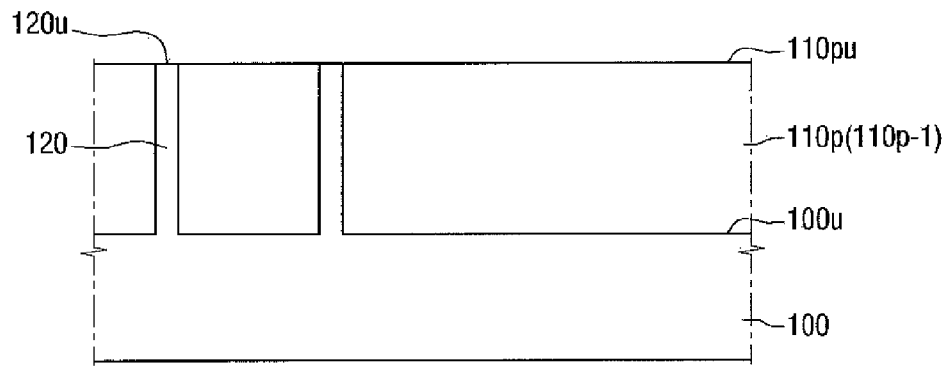

Referring to FIG. 8, the remaining portion of the upper pre-isolation layer 110p-2 may be removed by, for example, performing a second polishing process. As the result of the second polishing process, the pre-isolation layer 110p may be, for example, planarized to allow the upper surface 120u of the fin 120 and the upper surface 110pu of the pre-isolation layer 110p to be coplanar.

The second polishing process may be performed to remove the remaining portion of the upper pre-isolation layer 110p-2. The second polishing process may be, for example, a chemical mechanical polishing (CMP) process. The slurry used in the second polishing process may be a material having, for example, polishing selectivity with respect to a material forming the fin 120. For example, assuming that a speed at which the fin 120 is polished by the slurry used in the second polishing process is referred to as a first speed, and a speed at which the pre-isolation layer 110p is polished by the slurry used in the second polishing process is referred to as a second speed, the first speed is, for example, significantly smaller than the second speed. That is to say, during the second polishing process, an extent to which the pre-isolation layer 110p is polished may be, for example, significantly greater than an extent to which the fin 120 is polished. As a result, once the upper surface 120u of the fin 120 and the upper surface 110pu of the pre-isolation layer 110p are made to be coplanarly positioned, the polishing of the fin 120 and the pre-isolation layer 110p may be substantially stopped. Thereafter, even if the performing of the second polishing process is continued, the upper surface 120u of the fin 120 and the upper surface 110pu of the pre-isolation layer 110p may still be coplanarly positioned. That is to say, the second polishing process may be stopped once the fin 120 and the pre-isolation layer 110p are made to be coplanarly positioned.

For example, in an exemplary embodiment of the present invention, when the fin 120 is made of silicon and the pre-isolation layer 110p is made of silicon oxide, the slurry used in the second polishing process may be a poly stopping slurry. When the poly stopping slurry is used in the second polishing process, a ratio of a speed at which the fin 120 is polished by the slurry to a speed at which the pre-isolation layer 110p is polished may be, for example, no less than about 1:1000. The poly stopping slurry may be, for example, a polishing slurry which can substantially stop a polishing process in polysilicon.

In a case of performing the polishing process using a poly stopping slurry, it may be substantially stopped when the fin 120 is exposed during the polishing process. That is to say, the polishing process using the poly stopping slurry may be stopped in the fin 120. Therefore, even if the performing of the polishing process is continued after polysilicon is exposed, the fin 120 and the pre-isolation layer 110p may not further be polished.

In other words, during the polishing process using the poly stopping slurry, the fin 120 serves as a polishing stopping layer.

Figure 9:
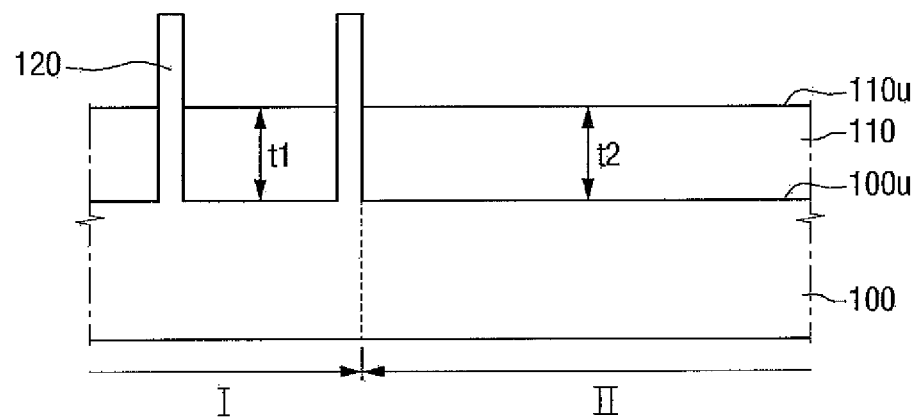

Referring to FIG. 9, the pre-isolation layer 110p, that is, a portion of the lower pre-isolation layer 110p-1, is removed, thereby forming an isolation layer 110. The isolation layer 110 may be formed making contact with a lower portion of the fin 120. The fin 120 may, for example, protrude from the isolation layer 110, and a protruding part of the fin 120 may be used as an active region of a transistor to be fabricated in a later process.

In addition, the upper surface 110u of the isolation layer 110 may be, for example, substantially parallel with the upper surface 100u of the substrate 100. That is to say, the upper surface 110u of the isolation layer 110 may be, for example, substantially coplanarly positioned not only on the first region I having the fin 120 but on the second region II without the fin 120 formed thereon. Here, the expression "being coplanarly positioned" may be used to mean that each distance between the upper surface 110u of the isolation layer 110 and the upper surface 100u of the substrate 100 at different locations of the upper surface 110u of the isolation layer 110 is substantially the same as each other but that there may be a small distance difference between the upper surface 110u of the isolation layer 110 and the upper surface 100u of the substrate 100 at different locations of the upper surface 110u of the isolation layer 110 due to a processing error.

In other words, assuming that a thickness of the isolation layer 110 formed on the first region I is referred to as a first thickness t1, and a thickness of the isolation layer 110 formed on the second region II is referred to as a second thickness t2, t1 may be, for example, substantially the same as t2.

Next, a method for fabricating a semiconductor device according to an embodiment of the present invention will be described with reference to FIGS. 1 to 3, 10 and 11.

Figure 10:
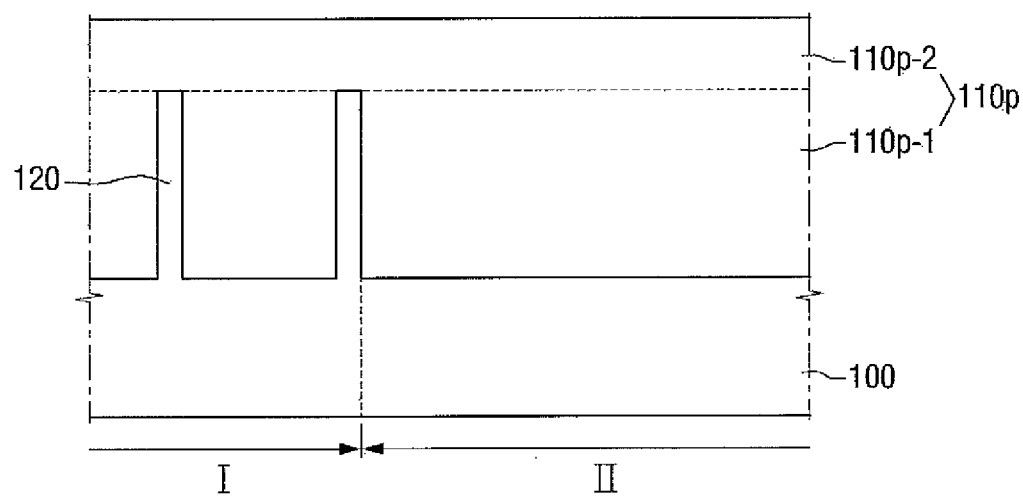
FIGS. 10 and 11 are cross-sectional views illustrating intermediate steps in a method for fabricating a semiconductor device according to an exemplary embodiment of the present invention.
Figure 11:
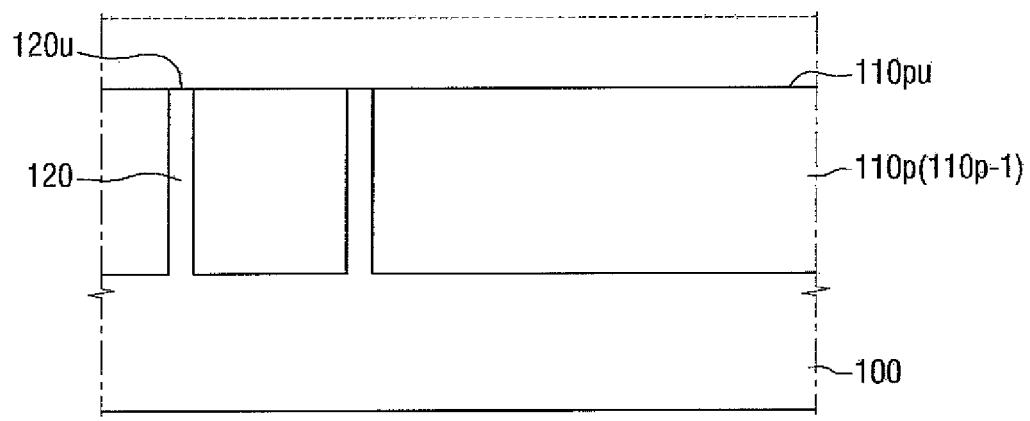

FIGS. 10 and 11 are cross-sectional views illustrating intermediate steps in a method for fabricating a semiconductor device according to an embodiment of the present invention.

Referring to FIGS. 1 to 3, the substrate 100 is etched using, for example, the second mask pattern 206 as an etch mask. As the portion of the substrate 100 is etched, the fin 120 may be formed on the substrate 100. The second mask pattern 206 may remain on the fin 120.

After forming the fin 120, the second mask pattern 206 remaining on the fin 120 may be removed by, for example, etching.

Referring to FIG. 10, a pre-isolation layer 110p covering the fin 120 formed on the substrate 100 may be formed. The pre-isolation layer 110p may be formed, for example, not only on the first region I having the fin 120 but on the second region II without the fin 120 formed thereon.

The pre-isolation layer 110p may include, for example, a lower pre-isolation layer 110p-1 and an upper pre-isolation layer 110p-2. The lower pre-isolation layer 110p-1 may be, for example, a portion of the pre-isolation layer 110p formed which makes contact with lateral surfaces of the fin 120, and the upper pre-isolation layer 110p-2 may be, for example, a portion of the pre-isolation layer 110p formed which does not make contact with the lateral surfaces of the fin 120.

Referring to FIG. 11, a portion of the pre-isolation layer 110p may be removed by, for example, performing a polishing process. As the portion of the pre-isolation layer 110p is removed, an upper surface 120u of the fin 120 is exposed. In other words, the upper pre-isolation layer 110p-2 is removed, thereby exposing the upper surface 120u of the fin 120.

As a result of the polishing process, the upper surface 120u of the fin 120 and the upper surface 110u of the pre-isolation layer 110p are made to be coplanarly positioned, thereby planarizing the pre-isolation layer 110p.

In the embodiment shown in FIGS. 1 to 9, the polishing process is separated into the first polishing process and the second polishing process to then be performed. However, in the present embodiment, the upper pre-isolation layer 110p-2 is removed by performing the polishing process once, thereby exposing the upper surface 120u of the fin 120. That is to say, as the first polishing process and the second polishing process are continuously performed, the upper pre-isolation layer 110p-2 is removed, thereby exposing the fin 120.

The slurry used in the polishing process for removing the upper pre-isolation layer 110p-2 may be, for example, a material having polishing selectivity with respect to a material forming the fin 120. For example, a speed at which the fin 120 is polished by the slurry used in the polishing process may be substantially smaller than a speed at which the pre-isolation layer 110p is polished by the slurry used in the polishing process. The slurry used in the polishing process for removing the upper pre-isolation layer 110p-2 may include, for example, a poly stopping slurry.

For example, the upper pre-isolation layer 110p-2 may be removed to expose the upper surface 120u of the fin 120, and impurities may then be doped into the fin 120 by ion implantation.

Hereinafter, a method for fabricating a fin-type field electric transistor (FinFET) as an exemplary semiconductor device will be described with reference to FIGS. 12 to 18.

FIGS. 12 to 18 are cross-sectional views illustrating a method for fabricating a fin-type field electric transistor (FinFET) using a semiconductor device according to an embodiment of the present invention.

Figure 12:
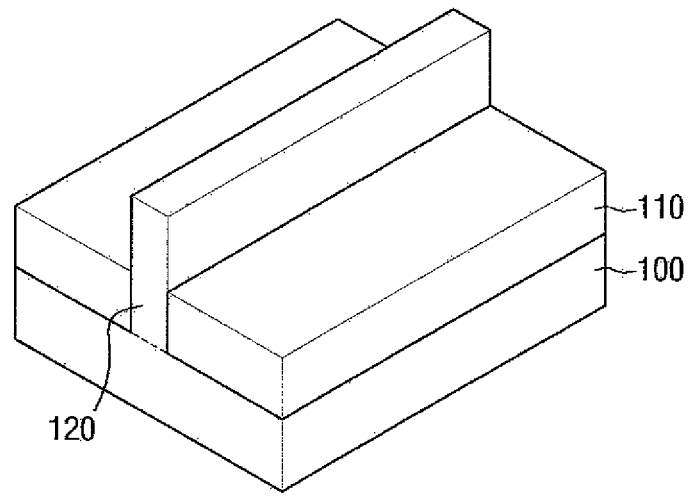
FIGS. 12 to 18 are cross-sectional views illustrating a method for fabricating a fin-type field electric transistor using a semiconductor device according to an exemplary embodiment of the present invention.

FIG. 12 is a perspective view illustrating one of fins shown in FIG. 9. The following description will be made with reference to FIG. 12.

Figure 13:
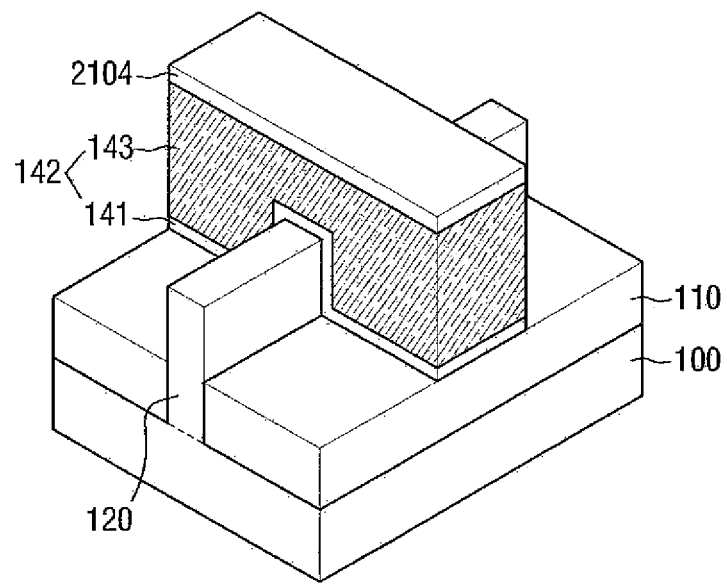

Referring to FIG. 13, an etching process is performed using, for example, a mask pattern 2104, thereby forming a dummy gate pattern 142 extending in a first direction X crossing the fin 120.

As a result, the dummy gate pattern 142 is formed on the fin 120. The dummy gate pattern 142 may overlap a portion of the fin 120. The fin 120 may include, for example, a portion covered by the dummy gate pattern 142 and a portion exposed by the dummy gate pattern 142.

The dummy gate pattern 142 includes, for example, a dummy gate insulation layer 141 and a dummy gate electrode 143. For example, the dummy gate insulation layer 141 may be a silicon oxide layer, and the dummy gate electrode 143 may be made of polysilicon.

Figure 14:
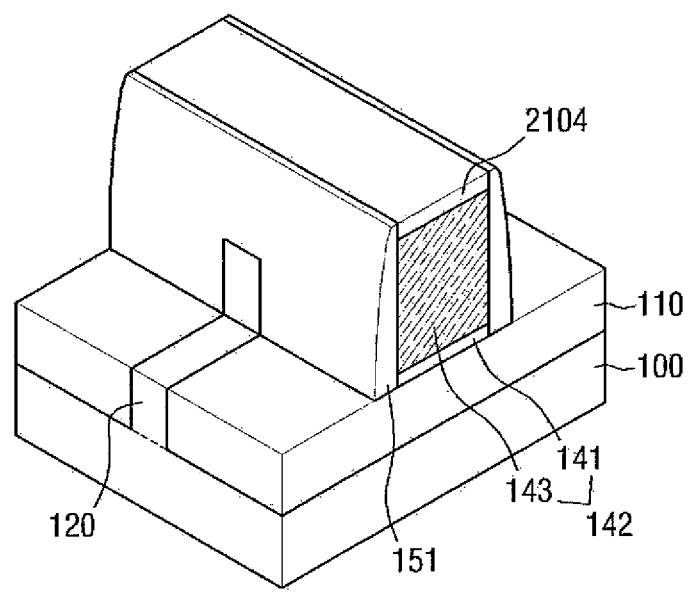

Referring to FIG. 14, a spacer 151 is formed on lateral surfaces of the dummy gate pattern 142. In other words, the spacer 151 may be formed, for example, on lateral surfaces of the dummy gate insulation layer 141 and the dummy gate electrode 143.

For example, an insulation layer is formed on the resultant product having the dummy gate pattern 142, followed by performing an etch-back process, thereby forming the spacer 151. The spacer 151 may, for example, expose an upper surface of the mask pattern 2104 and an upper surface of the fin 120 not overlapping the dummy gate pattern 142. The spacer 151 may include, for example, silicon nitride or silicon oxynitride.

Next, a portion of the fin 120 exposed to both sides of the dummy gate pattern 142 is removed, thereby forming a recess in the fin 120. In the present embodiment, the upper surface of the fin 120 exposed by the isolation layer 110 is, for example, coplanarly positioned with the upper surface of the isolation layer 110, but exemplary embodiments of the present invention are not limited thereto. That is to say, the upper surface of the fin 120 exposed by the isolation layer 110 may, for example, alternatively be recessed more toward the substrate 100 than the upper surface of the isolation layer 110.

Figure 15:
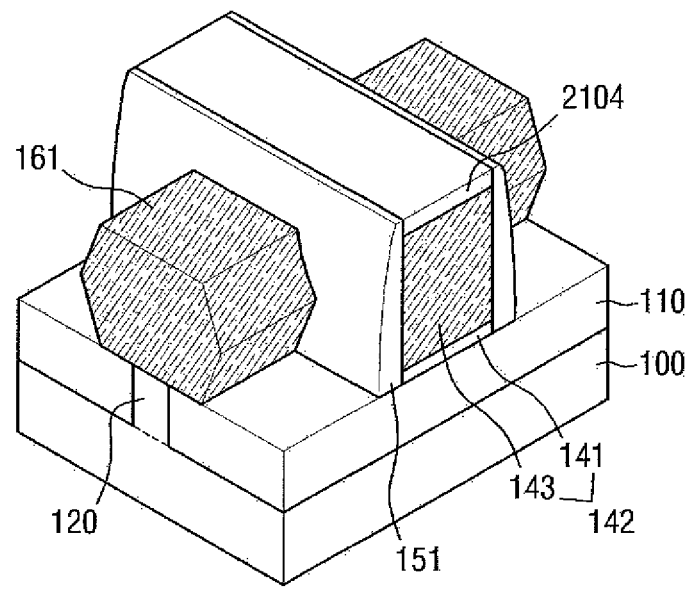
Figure 15:
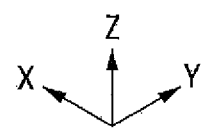

Referring to FIG. 15, a source/drain 161 is formed, for example, on the fin 120 exposed to both sides of the dummy gate pattern 142.

In a case where the fin-type transistor is a PMOS transistor, the source/drain 161 may include, for example, a compressive stress material. For example, when the substrate 100 is made of Si, the compressive stress material may be a material having a larger lattice constant than a lattice constant of silicon (Si), such as for example, silicon germanium (SiGe). The compressive stress material may increase the mobility of carriers in a channel region by applying compressive stress to the fin 120.

By contrast, in a case where the fin-type transistor is an NMOS transistor, the source/drain 161 may include, for example, the same material as the substrate 100 or a tensile stress material. For example, when the substrate 100 is made of Si, the source/drain 161 may include Si, or a material having a smaller lattice constant than a lattice constant of Si, such as for example, silicon carbide (SiC).

The forming of the source/drain 161 may be performed by, for example, performing an epitaxial process. In addition, when necessary, impurities may be, for example, in situ doped during the epitaxial process.

In the present embodiment, the source/drain 161 is shaped like, for example, a hexagon, but exemplary embodiments of the present invention are not limited thereto. That is to say, the source/drain 161 may have various shapes, including, for example, a diamond shape, a quadrangle shape, a pentagon shape, or the like, by controlling processing conditions of the epitaxial process for forming the source/drain 161.

Figure 16:
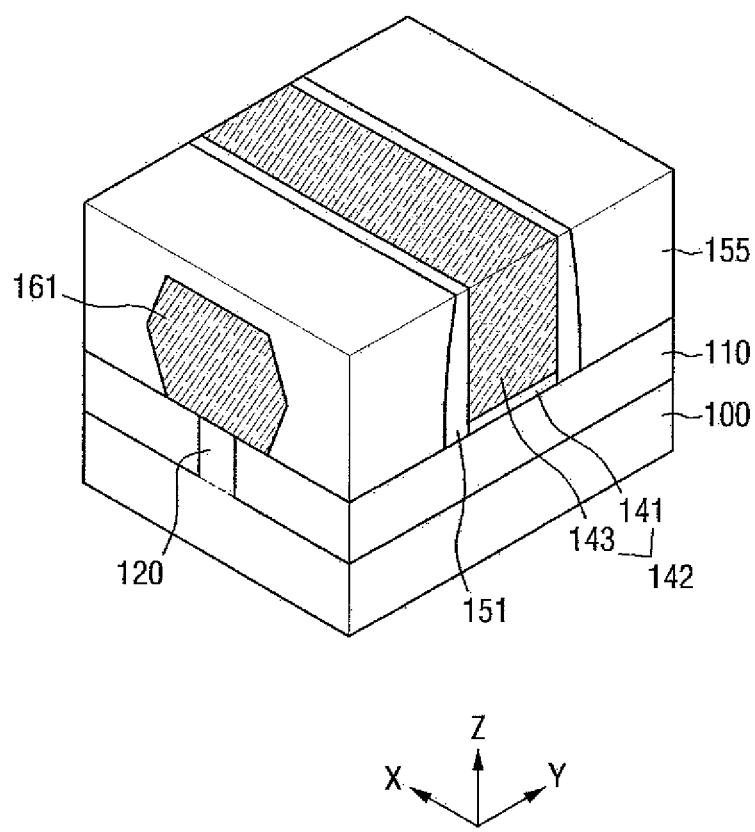

Referring to FIG. 16, an interlayer insulating layer 155 is formed on the resultant product having the source/drain 161. The interlayer insulating layer 155 may include, for example, at least one of an oxide, a nitride and an oxynitride.

Next, the interlayer insulating layer 155 is, for example, planarized until the upper surface of the dummy gate pattern 142 is exposed. As a result, the mask pattern 2104 may be removed and the upper surface of the dummy gate pattern 142 may be exposed.

Figure 17:
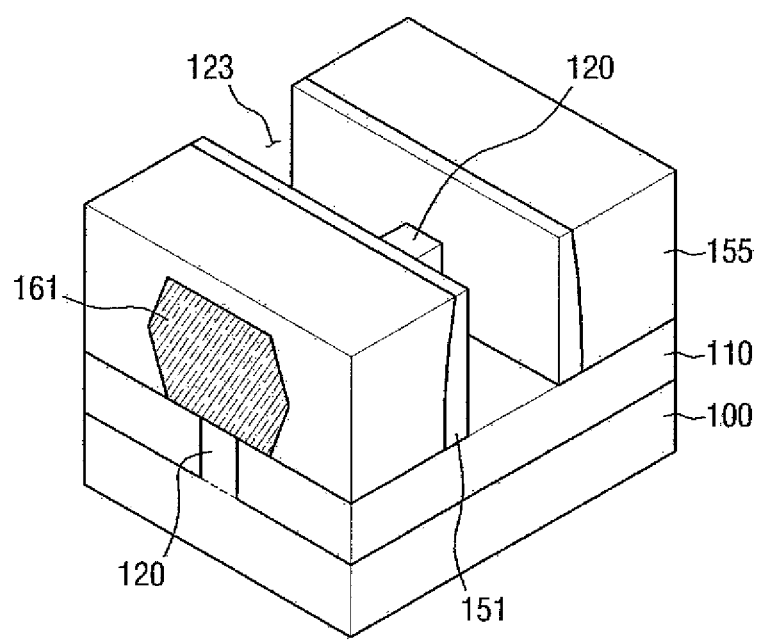

Referring to FIG. 17, the dummy gate pattern 142, that is, the dummy gate insulation layer 141 and the dummy gate electrode 143, may be removed.

As the dummy gate insulation layer 141 and the dummy gate electrode 143 are removed, a trench 123 exposing the isolation layer 110 and a portion of the fin 120 is formed.

Figure 18:
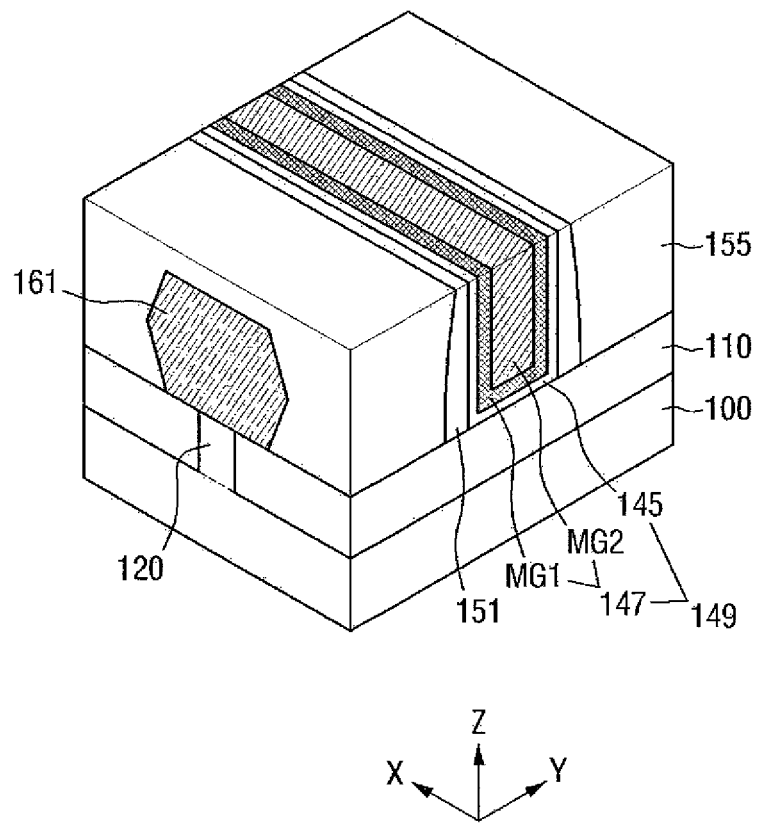

Referring to FIG. 18, a gate insulation layer 145 and a gate electrode 147 are formed in the trench 123, thereby forming a gate pattern 149.

The gate insulation layer 145 may be, for example, conformally formed along sidewalls and a lower surface of the trench 123. The gate insulation layer 145 may include, for example, a high-k material having a higher dielectric constant than a dielectric constant of a silicon oxide film. For example, the gate insulation layer 145 may include at least one selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but not limited thereto.

The gate electrode 147 may include, for example, metal gate layers MG1 and MG2. As shown in FIG. 18, the gate electrode 147 may have, for example, two or more metal gate layers MG1 and MG2 stacked. The first metal gate layer MG1 serves to adjust a work function, and the second metal gate layer MG2 serves to fill a space formed by first metal gate layer MG1. For example, the first metal gate layer MG1 may include at least one of titanium nitride (TiN), tantalum nitride (TaN), titanium carbide (TiC), and tantalum carbide (TaC), and the second metal gate layer MG2 may include tungsten (W) or aluminum (Al). The gate electrode 147 may include, for example, a non-metal material, such as Si, SiGe, etc. The gate electrode 147 may be formed by, for example, a replacement process, but exemplary embodiments of the present invention are not limited thereto.

Figure 19:
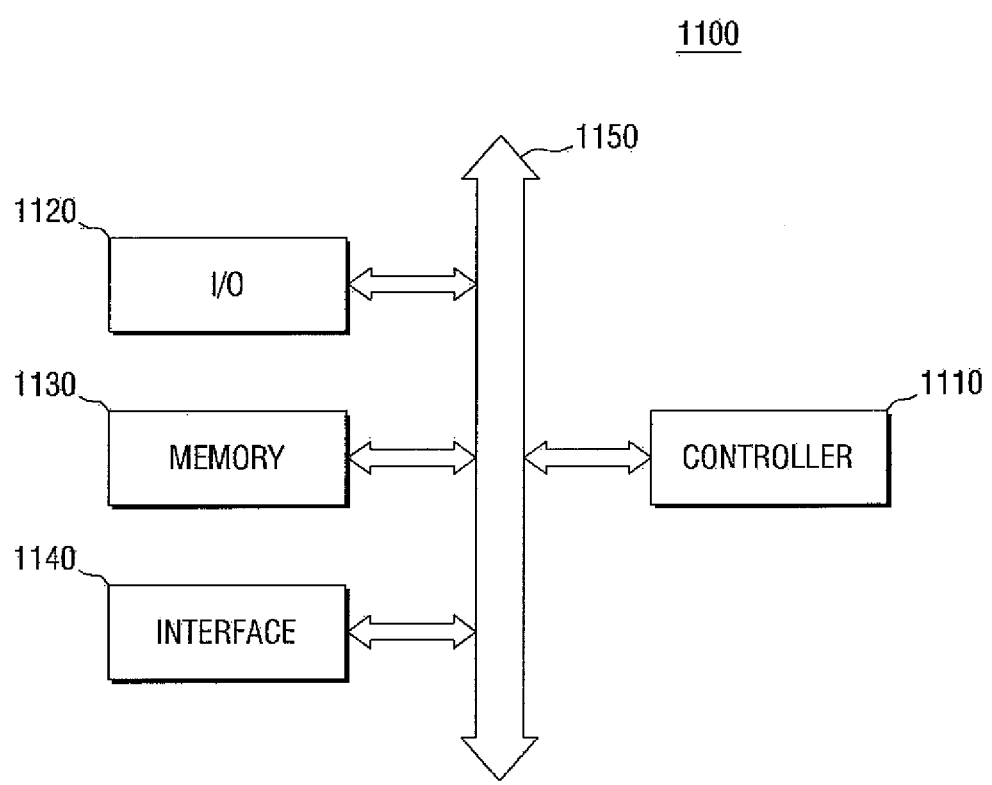
FIG. 19 is a block diagram of an electronic system including a semiconductor device according to an exemplary embodiment of the present invention.

FIG. 19 is a block diagram of an electronic system including a semiconductor memory device according to an exemplary embodiment of the present invention.

Referring to FIG. 19, the electronic system 1100 according to an exemplary embodiment of the present invention may include, for example, a controller 1110, an input and output device (I/O) 1120, a memory device 1130, an interface 1140, and a bus 1150. The controller 1110, the I/O 1120, the memory device 1130, and/or the interface 1140 may be coupled to each other via, for example, the bus 1150. The bus 1150 is a transfer pathway of data.

The controller 1110 may include, for example, at least one microprocessor, digital signal processor, and/or microcontroller, and at least one logic device that can execute functions similar to these. The I/O 1120 may include, for example, a keypad, a keyboard, and a display device. The memory device 1130 may store data and/or instructions. The interface 1140 transmits data to a communication network or receives data from a communication network. The interface 1140 may have a wired or wireless form. For example, the interface 1140 may include an antenna or a wire/wireless transceiver. Although not illustrated in FIG. 19, the electric system 1100 and an operation memory for increasing the operation of the controller 1110 may further include, for example, high-speed DRAM and/or SRAM. The fin type field effect transistor according to an exemplary embodiment of the present invention may be, for example, incorporated into the memory device 1130 or may be provided as a part of the controller 1110 or the I/O 1120.

The electronic system 1100 is applicable to, for example, a mobile system, a personal computer, an industrial computer, or a system carrying out various functions. For example, the mobile system may be a personal digital assistant (PDA), a portable computer, a web tablet, a wireless phone, a mobile phone, a digital music player, a memory card, or electronic products for transmitting/receiving information in wireless environments.

Figure 20:
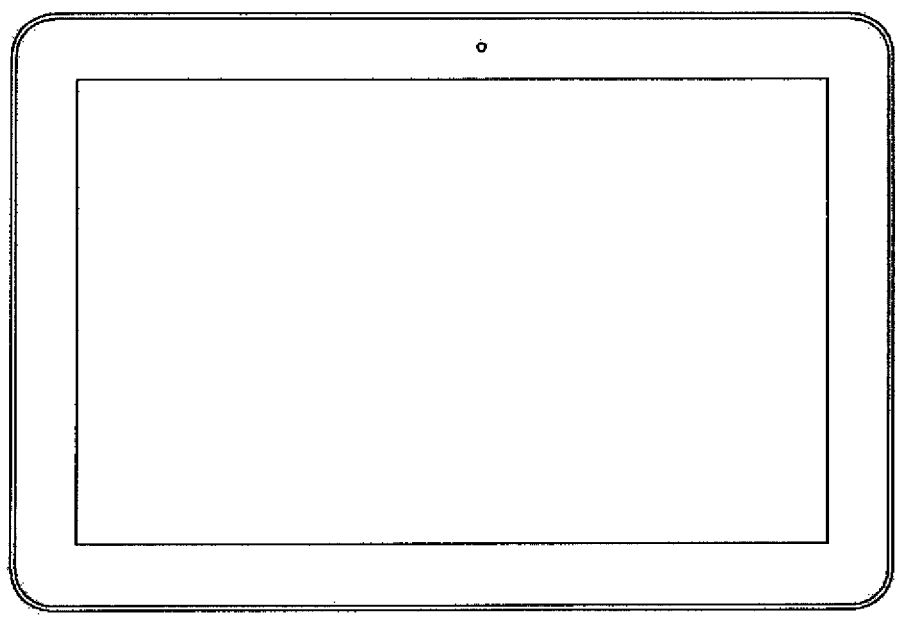
FIGS. 20 and 21 illustrate an exemplary semiconductor system to which a semiconductor device according to an exemplary embodiment of the present invention can be applied.
Figure 21:
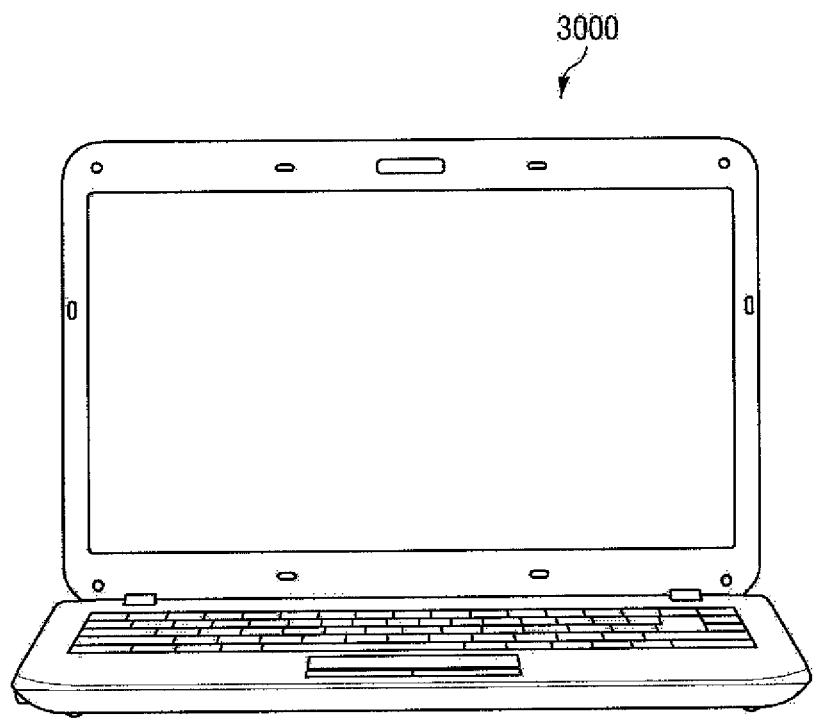

FIGS. 20 and 21 illustrate an exemplary semiconductor system to which a semiconductor device according to an exemplary embodiment of the present invention can be applied. For example, FIG. 20 illustrates a tablet PC 2000 and FIG. 21 illustrates a notebook computer 3000. At least one of the semiconductor devices according to an exemplary embodiment of the present invention can be applied to, for example, the tablet PC 2000, the notebook computer 3000, or the like. In addition, at least one of the semiconductor devices according to an exemplary embodiment of the present invention can be applied to other integrated circuit devices not illustrated herein.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A method for fabricating a semiconductor device, the method comprising:
   forming a pre-isolation layer covering a fin formed on a substrate, the pre-isolation layer including a lower pre-isolation layer making contact with the fin and an upper pre-isolation layer not making contact with the fin;
   removing a portion of the upper pre-isolation layer by performing a first polishing process; and
   planarizing the pre-isolation layer such that an upper surface of the fin and an upper surface of the pre-isolation layer are coplanar by performing a second polishing process for removing a remaining portion of the upper pre-isolation layer,
   wherein a first speed at which the fin is polished by a slurry used in the second polishing process is smaller to a second speed at which the pre-isolation layer is polished by the slurry used in the second polishing process.

2. The method of claim 1, wherein the slurry includes a poly stopping slurry.

3. The method of claim 1, wherein the forming of the pre-isolation layer comprises covering a mask pattern formed on the fin with the upper pre-isolation layer.

4. The method of claim 3, wherein the removing of the portion of the upper pre-isolation layer comprises exposing the mask pattern.

5. The method of claim 4, further comprising removing the mask pattern before the performing of the second polishing process.

6. The method of claim 5, further comprising doping impurities into the fin after the removing of the mask pattern.

7. The method of claim 4, further comprising performing a densification process on a remaining portion of the upper pre-isolation layer between the removing of the portion of the upper pre-isolation layer and the performing of the second polishing process.

8. The method of claim 1, further comprising forming an isolation layer making contact with a lower portion of the fin by removing a portion of the lower pre-isolation layer.

9. The method of claim 8, wherein an upper surface of the isolation layer is substantially parallel with an upper surface of the substrate.

10. The method of claim 1, wherein the first polishing process and the second polishing process are continuously performed to remove the upper pre-isolation layer, and wherein the first polishing process and the second polishing process are performed using a poly stopping slurry.

11. A method for fabricating a semiconductor device, the method comprising:
   forming a mask pattern on a substrate;
   forming a fin protruding on the substrate by etching the substrate using the mask pattern;
   forming a pre-isolation layer covering the fin and the mask pattern;
   exposing the mask pattern by removing a portion of the pre-isolation layer by performing a first polishing process; and planarizing the pre-isolation layer such that an upper surface of the fin and an upper surface of the pre-isolation layer are coplanar by performing a second polishing process after exposing the mask pattern and then exposing the upper surface of the fin, wherein a slurry used in the second polishing process includes a poly stopping slurry.

12. The method of claim 11, further comprising removing a portion of the isolation layer surrounding lateral surfaces of the mask pattern and removing the mask pattern, between the first polishing process and the second polishing process.

13. The method of claim 11, further comprising forming an isolation layer making contact with a lower portion of the fin by removing a portion of the pre-isolation layer after the exposing of the upper surface of the fin and wherein the substrate includes a first region and a second region, the fin is formed on the first region, and a thickness of the isolation layer formed on the first region is substantially the same as a thickness of the isolation layer formed on the second region.

14. A method for fabricating a semiconductor device, the method comprising:

forming a first mask pattern on a substrate;

forming a mask layer substantially conformally along an upper surface of the substrate having the first mask pattern;

patterning the mask layer to form a second mask pattern exposing the first mask pattern;

removing the first mask pattern to expose the substrate on both sides of the mask pattern;

forming a plurality of fins on a first region of the substrate but not on a second region of the substrate by etching the substrate using the second mask pattern;

forming a pre-isolation layer covering the fins and the second mask pattern remaining on upper surfaces of the fins;

exposing the second mask pattern by removing a portion an upper layer of the pre-isolation layer covering the fins by performing a first polishing process;

performing a densification process to oxidize the upper layer of the pre-isolation layer after exposing the second mask pattern;

removing a portion of the upper layer of the pre-isolation layer surrounding lateral surfaces of the second mask pattern;

removing the second mask pattern after removing the portion of the upper layer of the pre-isolation layer, thereby exposing the upper surfaces of the fins;

doping impurities into the fins after removing the second mask pattern;

removing the remaining portion of the upper layer of the pre-isolation layer by performing a second polishing process, thereby planarizing the pre-isolation layer such that the upper surface of the fins are coplanar with an upper surface of the pre-isolation layer; and removing a portion of a lower layer of the pre-isolation layer to thereby form an isolation layer which contacts a lower portion of the fins and wherein the fins protrude from isolation layer.

15. A method for fabricating a fin-type field effect transistor using the semiconductor device of claim 14, comprising:

forming a dummy gate pattern extending in a first direction crossing the fins protruding from the isolation layer by an etching process using a mask pattern, wherein the dummy gate pattern includes a dummy gate insulation layer and a dummy gate electrode disposed on the dummy gate insulation layer;

forming a spacer on lateral surfaces of the dummy gate insulation layer and the dummy gate electrode;

removing a portion of the fins exposed to opposing sides of the dummy gate pattern to form a recess in the fins;

forming a source/drain region on the fins exposed to the opposing sides of the dummy gate pattern after forming the recess in the fins;

forming an interlayer insulating layer on the resultant product having the source/drain planarizing the interlayer insulating layer until the mask pattern is removed and an upper surface of the dummy gate pattern is exposed;

removing the dummy gate insulation layer and the dummy gate electrode, thereby forming a trench exposing the isolation layer and a portion of the fins; and sequentially forming a gate insulation layer and a gate electrode in the trench to thereby defining a gate pattern in the trench.

16. The method of claim 15, wherein the substrate is made of silicon (Si), wherein the source drain includes silicon germanium (SiGe) having a larger lattice constant than a lattice constant of silicon (Si), wherein the gate electrode includes a first metal gate layer and a second metal gate layer, wherein the first metal gate layer includes at least one selected from the group consisting of titanium nitride (TiN), tantalum nitride (TaN), titanium carbide (TiC), and tantalum carbide (TaC) and the second metal gate layer includes at least one of tungsten (W) or aluminum (Al).

17. The method of claim 15, wherein the substrate is made of silicon Si), wherein the source drain includes silicon carbide (SiC) having a smaller lattice constant than a lattice constant of silicon (Si), wherein the gate electrode includes a first metal gate layer and a second metal gate layer, wherein the first metal gate layer includes at least one selected from the group consisting of titanium nitride (TiN), tantalum nitride (TaN), titanium carbide (TiC), and tantalum carbide (TaC) and the second metal gate layer includes at least one of tungsten (W) or aluminum (Al).

18. The method of claim 15, wherein the source/drain has one of the following shapes selected from the group consisting of a hexagon, a diamond, a quadrangle, and a pentagon.

* * * * *